(12) United States Patent
Payne et al.

(10) Patent No.: US 6,744,291 B2
(45) Date of Patent: Jun. 1, 2004

(54) POWER-ON RESET CIRCUIT (75) Inventors: James E. Payne, Boulder Creek, CA (US); Harry H. Kuo, San Jose, CA (US); Neville B. Ichhaporia, Santa Clara, CA (US); Jami N. Wang, Campbell, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/232,636

(22) Filed: Aug. 30, 2002

(65) Prior Publication Data

US 2004/0041601 A1 Mar. 4, 2004

(51) Int. Cl.[7] .............................................. H03L 7/00
(52) U.S. Cl. ........................................ 327/143; 327/198
(58) Field of Search ............................... 327/143, 198

(56) References Cited

U.S. PATENT DOCUMENTS

| 4,539,489 A | * | 9/1985 | Vaughn ...................... 327/206 |
| 4,558,233 A | | 12/1985 | Nakamori .................... 307/362 |
| 4,634,904 A | | 1/1987 | Wong ......................... 307/594 |
| 4,797,584 A | | 1/1989 | Aguti et al. ................. 307/594 |
| 4,970,408 A | | 11/1990 | Hanke et al. ............. 307/272.3 |
| 4,984,043 A | * | 1/1991 | Vinal ......................... 257/365 |
| 5,030,845 A | | 7/1991 | Love et al. .............. 307/272.3 |
| 5,243,233 A | | 9/1993 | Cliff ......................... 307/296.4 |
| 5,278,458 A | | 1/1994 | Holland et al. .......... 307/272.3 |
| 5,463,335 A | | 10/1995 | Divakaruni et al. ......... 327/143 |
| 5,467,039 A | | 11/1995 | Bae ............................ 327/198 |
| 5,534,804 A | | 7/1996 | Woo ........................... 327/143 |
| 5,703,804 A | * | 12/1997 | Takata et al. ............... 365/145 |
| 5,767,710 A | | 6/1998 | Cho ........................... 327/143 |
| 5,821,787 A | | 10/1998 | McClintock et al. ....... 327/143 |
| 5,936,444 A | | 8/1999 | Pathak et al. ............... 327/143 |
| 5,942,925 A | | 8/1999 | Stahl .......................... 327/143 |
| 5,946,267 A | | 8/1999 | Pathak et al. ............... 365/233 |
| 6,111,441 A | | 8/2000 | Hartley et al. .............. 327/143 |
| 6,204,704 B1 | | 3/2001 | Williams et al. ............ 327/143 |
| 6,236,249 B1 | | 5/2001 | Choi et al. .................. 327/143 |
| 6,288,584 B1 | | 9/2001 | Wu et al. ..................... 327/143 |
| 6,310,485 B1 | * | 10/2001 | McClure ..................... 324/760 |
| 6,362,669 B1 | | 3/2002 | Zhou et al. .................. 327/143 |
| 2001/0019281 A1 | | 9/2001 | Polizzi et al. ............... 327/143 |

FOREIGN PATENT DOCUMENTS

JP          63221711 A    *   9/1988   .......... H03K/17/22

* cited by examiner

*Primary Examiner*—Terry D. Cunningham
*Assistant Examiner*—Quan Tra
(74) *Attorney, Agent, or Firm*—Thomas Schneck (57) ABSTRACT

A power-on reset (POR) circuit comprises a transistor connected ad diodes for setting temperature time delay coupled to a power supply voltage, a transistor switch, and buffering circuits. The trip point voltage of the POR circuit depends only on one type of transistor, such as the switching transistor so that the p-to-n skew variations do not affect the trip point. The switching transistor has a resistor connected from base to ground and another resistor connected to the power supply voltage to limit current flow during transitions.

13 Claims, 5 Drawing Sheets

POWER-ON RESET CIRCUIT

TECHNICAL FIELD

The invention broadly relates to a power-on reset circuitry, especially those circuits that are adapted for low power consumption and high-density integrated circuits.

BACKGROUND ART

In semiconductor integrated circuits (IC) with latches and memory components, initial conditions are important. Incorrect initial conditions cause severe timing problems, as well as wrong states to the IC circuits. Power-on reset circuits are designed to correct initial value problems to the IC circuits. When the power supply voltage is first applied to an IC circuit, the power-on reset circuit detects the rising power supply voltage and provides a reset signal for initializing flip-flops, latches, counters, registers and other such internal components of a semiconductor IC circuit. When the power supply voltage is on, the reset signal is at first maintained low for a sufficient time to allow stabilization of the respective components of the circuit. After a predetermined time, the reset signal is switched to a logic high to reset the components of the circuit for as long as the power supply is needed to be on. We hold the part in reset until a voltage is reached that it can operate.

To achieve effective power-on reset (POR) circuits, consideration must be given to steady-state power dissipation, chip layout, production costs and the stability of the reset signal. It is customary to design a POR circuit on the same IC area as the main circuit. Some of the IC area is devoted to the POR circuit. In addition, to save the layout area, the use of passive elements such as resistors and capacitors that occupy a relatively large area, and depletion mode transistors which require additional manufacturing steps, must be avoided. Therefore, it is desirable to have the POR occupy as little area as possible.

It is also desirable for a POR circuit to have as little current flow as possible during operation because current flow represents power consumption. The values of parasitic components vary with manufacturing process, temperature, and voltage variations. The co-existence of a plurality of p-channel and n-channel MOS transistors in many POR circuits create parasitic paths and unwanted current flows. During transition, e.g., the reset signal switched from low to high, current tends to find a way to flow from high voltage areas to lower voltage areas such as electrical ground. Therefore, parasitic components probably created by the p-type to n-type skew variations during fabrication process also needed to be minimized.

It is also desirable to have a reset signal that is stable with temperature and voltage variations. When the reset signal is not stable, the initial conditions may confuse the IC circuit at the change of condition. Usually, the reset signal varies due to temperature change and variations between p-channel and n-channel transistors during manufacturing process. The reset signal needs to change at an exact voltage level called trip voltage. If there is a skew in p-channel to n-channel in the design of the MOS triggering device such as inverters in a POR circuit, the trip voltage is shifted to an undesired value, thus delaying the reset signal and causing serious timing problems.

Figure 1:
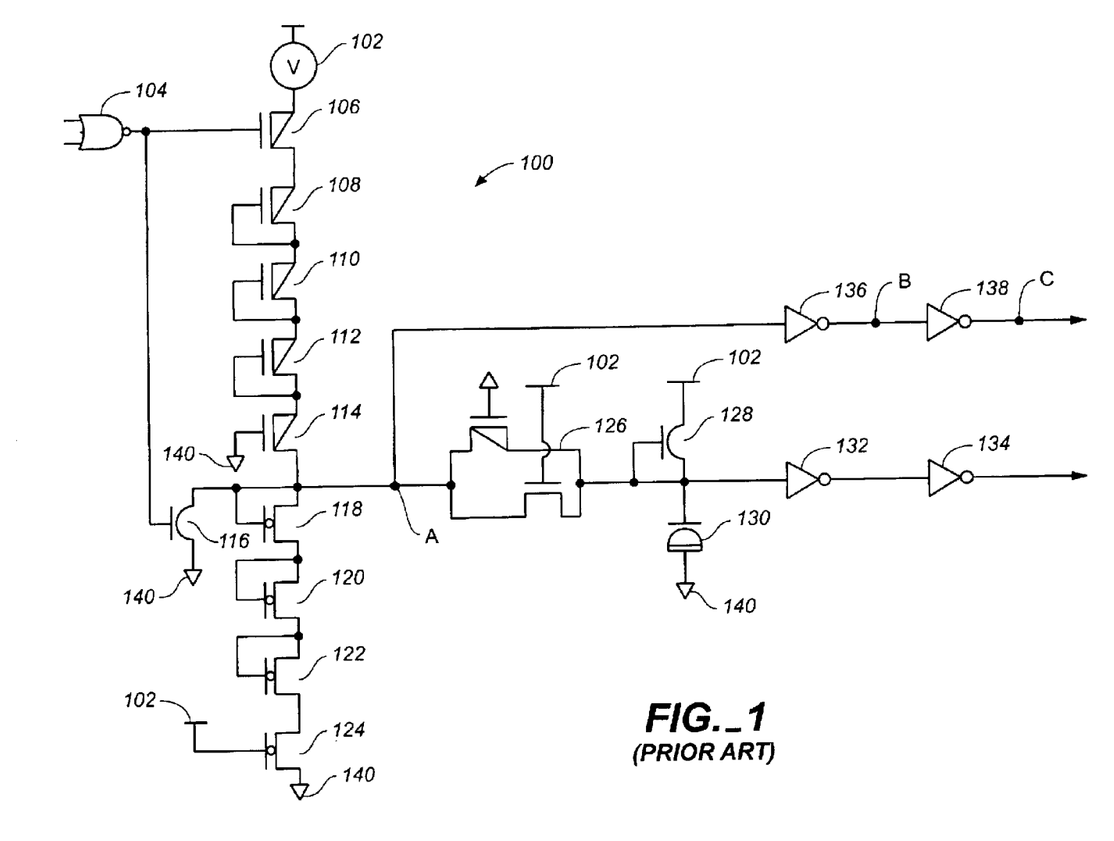
FIG. 1 is a schematic diagram illustrating a power-on reset circuit according to the prior art.

A large variety of power-on reset circuits have been proposed to solve the above problems, such as the one described in FIG. 1.

With reference to FIG. 1, a 3.8 volt power-on reset circuit 100 generates a reset pulse when a power supply voltage 102 ramps up from 0 volt to 5 volts. When the power supply voltage reaches 3.8 volts, the POR circuit 100 detects this voltage and generates a reset pulse.

The POR circuit 100 employs the principle of a time delay circuit coupled to a pulse detector and a series of inverter buffers to generate a reset pulse. The delay circuit has a series of diode-connected transistors to set a trip point voltage. When the trip point voltage is reached, the POR circuit 100 begins to operate. The pulse detector detects the threshold voltage and generates a pulse. The buffers either pass or invert the pulse to the output.

The operation of the POR circuit 100 can be observed at key nodes A, B and C. Referring again to FIG. 1, the gate of a first p-type zero-threshold transistor 118 of the POR circuit 100 forms node A and coupled to two inverters 136 and 138. These two inverters are coupled together in series. The output terminal of the first inverter 136 forms node B and coupled to the input of the input terminal of the second inverter 138. The output terminal of the second inverter 138 forms node C and an output PORS.

The trip point of the POR circuit 100 is set by a transistor 128. The transistor 128 has its drain coupled to the power supply voltage 102, its gate coupled to the drain and to the first terminal of a CMOS capacitor 130. The second terminal of the CMOS capacitor is coupled to the electrical ground 130. The source of the transistor 128 is coupled to the input terminal of a third inverter 132. The output terminal of the third inverter 132 is coupled to the input terminal of the fourth inverter 134.

Usually, it takes milliseconds for the power supply voltage 102 to rise from 0 volt to full value. When the power supply voltage 102 reaches the threshold voltage of 3.8 volts, the three diode-connected transistors 108, 110, and 112 start to conduct. The voltage at node A follows the rising power supply voltage 102. Before the trip point voltage set by the transistor 128 is reached, the p-type transistors 118, 120, and 122 pull down the voltage of node A to ground. The transistor 128 pulls up the output PORS because the drain is at a voltage higher than the gate and the source, which are tied together. Therefore, before the threshold voltage is reached, the voltage of node A is zero. After the trip point voltage has been reached, the voltage at node A tracks the rising voltage of the power supply voltage $V_{CC}$. The transistor 128 is in the cut-off state and the voltage at the PORS terminal goes low. Thus, the voltage at the terminal C goes high. The capacitor 130 is charged up during the period the voltage at A is zero. Therefore, there are no current flows from $V_{CC}$ To ground when the POR circuit transitions from high to low.

An object of the invention is to provide a power-on reset circuit that has a trip point independent of the fabrication process variation and zero power consumption during operation.

Another object of the present invention is to provide a power-on reset circuit that is immune to narrow width effects within sub-micron CMOS transistor logic channel.

DISCLOSURE OF THE INVENTION

The above objects have been achieved by a power-on reset circuit which is implemented entirely by devices coupled together in series including a temperature-independent time delay circuit, a switching transistor having a resistor to ground for reducing leakage current and a trip point dependent on only one type of transistor, and buffers. The trip point voltage depends on only one type of transistor so that p-to-n skew due to process variations or temperature changes is not a factor. Finally, the resistor reduces threshold leakage current during voltage transitions. This permits wide transistors to be used, instead of narrow long transistors in the stack. These transistors switch more abruptly once threshold is reached, so process variations are no longer a significant factor in power consumption.

BEST MODE OF CARRYING OUT THE INVENTION

Figures 2, 3:
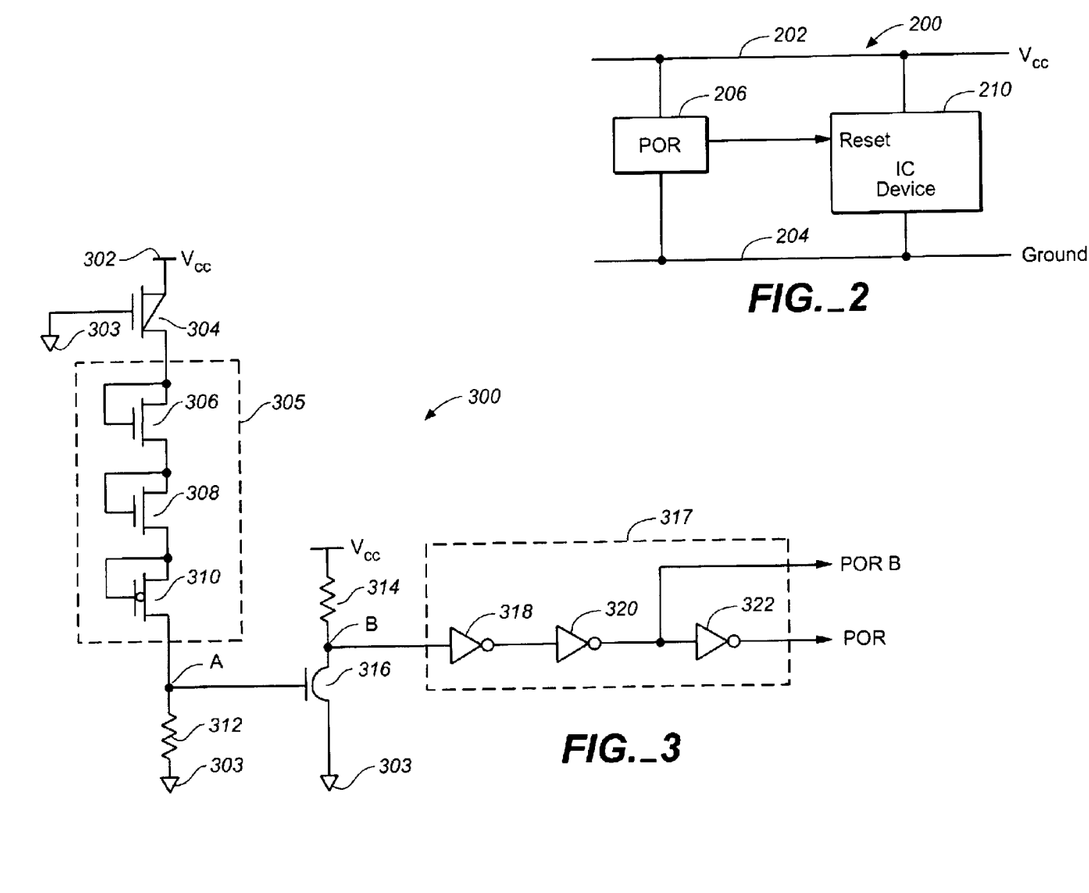
FIG. 2 is a diagram of a digital system that uses the power-on reset according to the present invention.
FIG. 3 is a schematic diagram of the preferred embodiment of the present invention.

With reference to FIG. 2, a power-on reset (POR) circuit 206 is coupled to a semiconductor integrated circuit (IC) device 210. Both the POR circuit 206 and the other circuitry 210 are coupled to a power supply voltage 202, and an electrical ground 204 to send a reset signal to refresh the IC device 210. It may form part of the integrated circuit, sharing the power supply voltage and ground on internal lines, and supplying an ON signal to other circuitry within the IC device. The IC device 210 can be a memory array, an EEPROM, or any sequential circuits that require initial operating conditions. When the system 200 first begins, the power supply voltage 202 increases from 0 volt to $V_{CC}$. Usually, it takes a few milliseconds for the power supply voltage 202 to reach full value $V_{CC}$. The IC device 210 has a plurality of flip-flops, latches, or sequential circuits such as registers and counters, etc. Before the device 210 is turned on, the POR circuit 206 resets all the components of the device 210 to their correct initial values. When the power supply voltage 202 is turned on and reaches a certain voltage level called the trip point, the POR circuit 206 sends out an ON signal to assert to the digital device 210 that the system 200 has been started. The detailed description of the POR circuit 206 and how it asserts an ON signal to the IC device 210 will be discussed below. The POR circuit 206 in FIG. 2 is the same as the POR circuit described in FIG. 3 and its alternative embodiments in FIG. 5 and FIG. 6.

In reference to FIG. 3, a power-on reset (POR) circuit 300 comprises a p-channel MOS transistor 304 coupled to a voltage supply 302, a temperature-independent voltage delay circuit 305 coupled in series to a switching transistor 316, and a buffer circuit 317. The switching transistor 316 further comprises a current-limiting resistor 312 coupled to an electrical ground 303 and a pull-up resistor 314. Both resistors 312 and 314 there to limit current flow during transitions.

All components of the POR circuit 300 listed above are coupled in series. In the preferred embodiment, all the components are MOS. Therefore, the POR circuit 300 is simple to manufacture.

When the system 300 in FIG. 3 starts, the power supply voltage 302 begins to ramp up, the p-channel MOS transistor (PMOS) 304 couples the power supply voltage 302 and protects the POR circuit 300 from ESD and latch-up. The delay circuit 305 delays the rising power supply voltage 302 for a specified amount of voltage set by the transistors 306, 308, and 310 of the time delay circuit 305. As soon as the threshold voltage is reached, the output voltage of the delay circuit 305 begins to track the rising power supply voltage 302. At node A, the voltage tracks the rising output of the time delay circuit 305. At first the output B of the switching transistor 316 follows the power supply voltage $V_{CC}$ 302 because the transistor 316 is cut-off and point B is pulled high to $V_{CC}$. The output of the switching transistor 316 is pulled low when the trip point is reached. As discussed briefly above, the involuntary variations between n-channel and p-channel during the manufacturing can cause the cut-off or saturation point of a transistor to shift, causing undesired trip point. In the present invention, the trip point depends on the n-channel MOS transistor 316. Therefore, it is immune from the p-channel to n-channel variations in a MOS inverter.

The buffer circuit 317 either inverts or buffers the signal from the switching transistor 316. If the output signal from transistor 316 is inverted, it forms the POR output terminal. If the reset signal is buffered, it forms the PORB output terminal.

Above is the description of the block structure of the POR circuit 300 and how it functions in general. One of the salient points of the invention is that the trip point of the POR circuit 300 only depends on one type of transistor, which is n-channel MOS transistor so that the variation between n-channel and p-channel found in prior art will not affect or change the trip point of the POR circuit 300. Other salient points of the present invention include the resistors 312 and 314. The resistors 312 and 314 further limits current flow when transition occurs. Furthermore, the components of the POR circuit 300 are connected in series and depend on one type of transistors. Therefore, the POR circuit 300 is simple, compact in size, and easy to manufacture. Such design eliminates the parasitic components that cause current flow and power consumption.

The detailed description of the POR circuit 300 reveals salient points of the invention.

Figure 5:
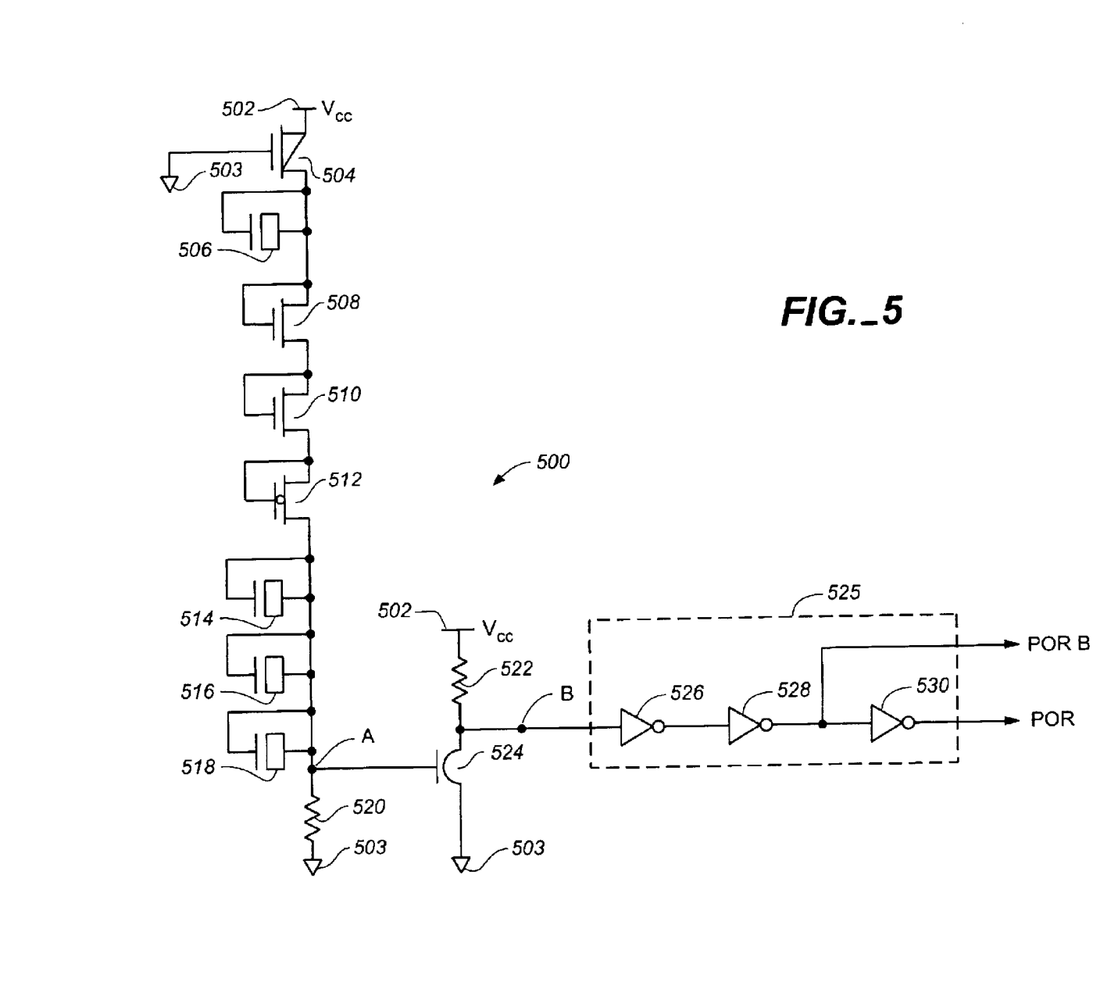
FIG. 5 is a schematic diagram of an alternative embodiment of the circuit of FIG. 3.

Referring again to FIG. 3, the p-channel MOS transistor (PMOS) 304 has its source coupled to the power supply voltage 302, its gate coupled to the electrical ground 303, and its drain coupled to the means for setting a temperature-independent time delay 305. The time delay circuit 305 further comprises three diode-connected transistors in series: a first diode-connected n-channel MOS transistor (diode) 306, a second diode-connected n-channel MOS transistor (diode) 308, and a third diode-connected n-channel MOS transistor (diode) 310. The gate of the first diode 306 is coupled to its drain and to the source of the PMOS transistor 304. The gate of the second diode 308 is coupled to its drain and to the source of the diode 306. The gate of the third diode 310 is coupled with its drain and to the source of the second diode 308. Each of the above diodes has a threshold voltage of 0.7 volts, obviously, these three diodes are coupled together in series and have a total threshold voltage of ($V_T$) 1.6 volts. The third diode 310 is a low-threshold n-channel MOS transistor having threshold voltage about 0.2 volts. In this embodiment, three diodes 306, 308, and 310 set the threshold voltage to 1.6 volts. However, it is obvious to a person of ordinary skill in the art that many diodes can be stacked in series to set a higher threshold voltage. Threshold voltage in a diode is very stable with temperature and process variations. FIG. 5 shows an alternative embodiment of the POR circuit 300 that includes optional diode-connected transistors to set higher threshold voltage or longer time delay. FIG. 5 will be discussed in more detail later.

The first terminal of the resistor 312 is coupled to the source of the third diode 310 and the second terminal of the resistor 312 is coupled to the electrical ground 303. The junction between the first terminal of the resistor 312 and the source of the third diode 310 form a node A. Node A is coupled to the switching transistor means 316.

In a preferred embodiment, the switching transistor 316 is a n-channel MOS transistor having a gate coupled to node A, the source coupled to the electrical ground 303 and the drain coupled to the second terminal of a pull-up resistor 314. The first terminal of the pull-up resistor 314 is coupled to the power supply voltage 302.

The junction between the output of the switching transistor 316 and the second terminal of the pull-up resistor 314 forms node B and is coupled to the buffer circuit 317. The buffer circuit 317 comprises three MOS inverters coupled in series to one another. The input terminal of a first inverter 316 is coupled to the output of the switching transistor 314 at node B, the output of the first inverter 318 is coupled to the input terminal of the second inverter 320. The output of the second inverter 320 is coupled to the input terminal of the third inverter 322 and forms the output PORB. The output terminal of the third inverter 322 forms the output terminal POR. The output POR is fed to a reset ON pin of the IC device 210 as shown in FIG. 2.

All components of the POR circuit 300 are mainly MOS transistors and connected in series. Therefore, the POR circuit 300 is simple, compact in size, and easy to manufacture.

Figure 4:
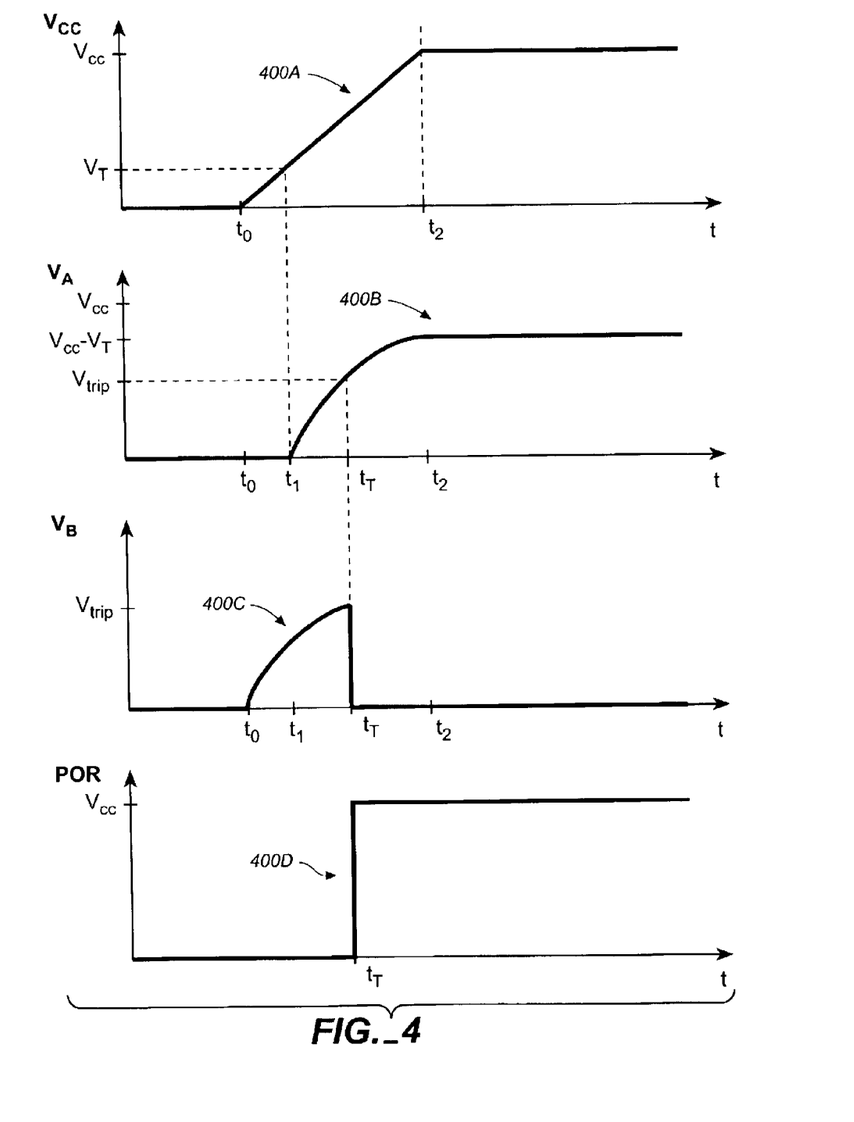
FIG. 4 is a drawing of waveforms which are useful in the description of preferred embodiment of the present invention.

Referring to FIG. 4, Graph 400 illustrates how the POR circuit 300 functions. Graph 400A depicts the time response of the $V_{CC}$ 302. Graph 400B illustrates the response of node A. Graph 400C is the response of node B, and graph 400D is the response of the output POR. In graph 400A, at time $t_0$ a power supply voltage is applied to the POR circuit 300 described above. The power supply voltage starts to ramp up at $t_0$ and reach $V_T$ at time $t_1$ and $V_{CC}$ at time $t_2$. Usually, $V_{CC}$ for CMOS is 5 volts, but it can be any values depending on the circuits and the design requirements. Graph 400A describes the graph of the power supply voltage 302 of the POR circuit 300. In graph 400B, before $V_{CC}$ reaches the threshold voltage ($V_T$) set by the temperature independent voltage delay circuit 305, the voltage at node A is zero. Therefore, from 0 to $t_1$, voltage at node A is zero. After the threshold voltage ($V_T$) set by the circuit 305 has been reached, the diodes start to conduct and node A tracks the rising voltage of $V_{CC}$ until it reaches maximum value of $V_{CC}-V_T$. $V_T$ is the total threshold voltages set by three diodes 306, 308, and 310. The curvature of graph 400B is due to parasitic capacitance of the delay circuit 305. The maximum value at node A is $V_{CC}$ minus the threshold voltage ($V_T$).

Referring to graph 400C, before the trip point voltage is reached, the output voltage at node B of the transistor 316 follows $V_{CC}$ because the NMOS transistor is in the cut-off state and the resistor 314 pulls up node B to the rising $V_{CC}$ Voltage $V_B$ starts at $t_0$ and as soon as the voltage at node A reaches the trip point voltage at time $t_T$, the transistor 316 is turned on and pulls the voltage at node B down to ground at time $t_T$ as illustrated in graph 400C. Therefore, in graph 400D, the graph of the output POR is the reverse of the voltage of node B.

The POR circuit 300 is all digital. Therefore, it eliminates distortion problems of analog circuits.

In reference to FIG. 5, an alternative embodiment of the a low-power consumption power-on reset (POR) circuit 500 comprises a p-type transistor 504 coupled in series with an optional diode-connected transistor 506 for protecting the POR circuit 500 against electrostatic discharge (ESD) and latch-up; a diode means for setting a temperature-independent time delay 508, 510, and 512; optional diode-connected transistors 514, 516, 518; a switching transistor 522 having a trip point dependent on one type of transistor, and further comprises a resistor 522 connected to an electrical ground 503 so that a current flows through said resistor is limited. The POR circuit 500 has a buffer circuit 525 electrically coupled to the switching transistor 522. The buffer circuit 525 further includes three inverters 526, 528, and 530 coupled in series as in the POR circuit 300 in FIG. 3. The POR circuit 500 operates in the same manner as the POR circuit 300 except that the POR circuit 500 has higher time delay because of the optional diode connected transistors 514, 516, and 518. The responses of the POR circuit 500 at $V_{CC}$, nodes A and B and output POR are similar to those in FIG. 4 except that t, is further to the right because the optional diodes 514, 516, 518 set a longer time delay and accordingly the amplitude $V_{CC}-V_T$ of node A is lower. In reality, the curves shown in FIG. 4 are not that smooth.

In another embodiment of the invention, pull-up and pull-down capacitors make the power-on reset circuit even more digital, smoother responses and further blocks current flow during active period.

Figure 6:
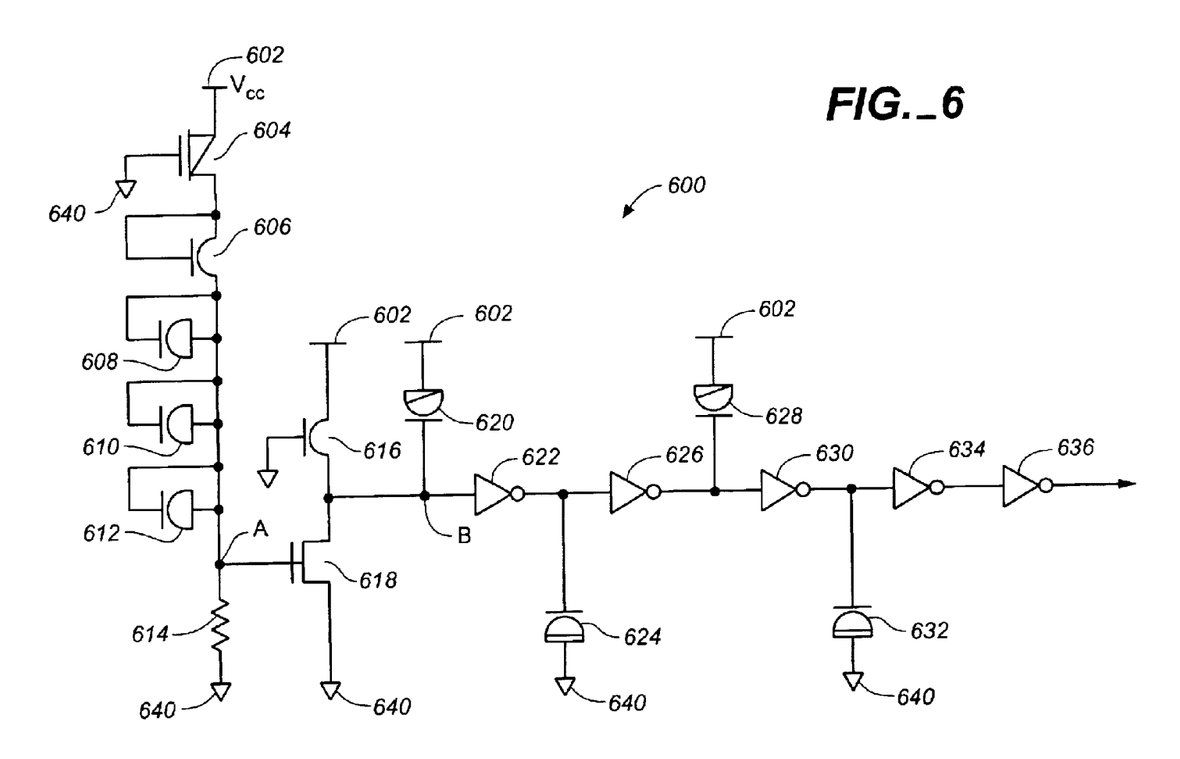
FIG. 6 is a schematic diagram of an alternative embodiment according to the present invention.

FIG. 6 illustrates another embodiment of the invention. A power-on circuit (POR) 600 is a variation of the POR circuit 300 discussed above. The POR circuit 600 has the same basic structure as the POR circuit 300, and POR circuit 500 but different trip point and extra PMOS pull-up and pull-down capacitors at the output terminals in order to make the output signal of the POR circuit completely digital.

Referring to FIG. 6, a p-channel MOS transistor 604 having a source electrically coupled to a power supply voltage 602 for latch up and ESD protection, and a gate electrically coupled to an electrical ground 640. The POR circuit 600 sets a temperature-independent threshold voltage by a diode-connected n-channel MOS transistor (diode) 606 coupled in series with the drain of the transistor 604. Three optional diode-connected transistors (diodes) 608, 610, and 612 are coupled in series if higher threshold or time delay is desired. The first optional diode-connected transistor (diode) 608 is coupled to the source of the diode 606. The optional diodes are used to change the time delay.

The POR circuit 600 also comprises a resistor 614 having a first terminal coupled to the third optional diode 612 and forms a node A. If the optional diodes are not used, the pull-down resistor is coupled to the diode 606. A second terminal of the resistor 614 electrically coupled to the electrical ground 640 so that the current flows from the power supply voltage to ground is limited at each transition of node A. Still, the POR circuit 600 further comprises a n-channel MOS transistor 618 having a gate electrically coupled to the first terminal of the pull-down resistor 614 at node A, a source electrically coupled to the electrical ground 640. A first pull-up p-channel enhancement mode MOS transistor 616 having a drain electrically coupled to the power supply voltage 602, a gate coupled to the electrical ground 640, and a source electrically coupled to the drain of the NMOS transistor 618, which forms a node B. After node B, the POR circuit 600 comprises pull-up and pull-down capacitors and five MOS inverters. A first pull-up MOS capacitor 620 having a first terminal coupled to the voltage power supply 602 and a second terminal coupled to node B. A first MOS inverter 622 having an input terminal coupled to the second terminal of the first MOS capacitor 620. A first pull-down MOS capacitor 624 having a first terminal coupled to the output of the first MOS inverter 622, and the second terminal coupled to the electrical ground 640. A second MOS inverter 626 having an input terminal electrically coupled to the output terminal of the first MOS inverter 622. A second pull-up MOS capacitor 628 having the first terminal electrically coupled to the output terminal of the second CMOS inverter 626 and a second terminal coupled to the power supply voltage 602; a third MOS inverter 630 having an input terminal electrically coupled to the output terminal of the second MOS inverter 626; a second pull-down MOS capacitor 632 having a first terminal coupled to the electrical ground 640 and a second terminal electrically coupled to the output terminal of the third MOS inverter 630; a fourth MOS inverter 634 having an input terminal coupled to the output terminal of the third MOS inverter 630; and a fifth MOS inverter 636 having an input terminal electrically coupled to the output terminal of the fourth MOS inverter 634 and an output terminal forms an output of the CMOS POR circuit 600.

The POR circuit 600 functions very similar to the POR circuit 300 and its alternative embodiment, POR circuit 500 described above in FIG. 3 and FIG. 5 respectively. The voltage responses at node A and B of the POR circuit 600 are similar to those of the POR circuit 300 described in FIG. 4. However, the POR circuit 600 has smoother voltage response curves than the POR circuit 300 because the pull-up and pull-down capacitors.

What is claimed is:

1. A power-on reset (POR) circuit, comprising:
   (a) a plurality of diode means for setting a temperature-independent time delay, said plurality of diode means being electrically coupled to a power supply voltage with at least one of said plurality of diode means having a low threshold voltage;
   (b) a switching transistor means coupled to the plurality of diode means for setting the temperature independent time delay, the POR circuit having a trip point which depends solely on characteristics of said switching transistor means; and
   (c) a buffer circuit electrically coupled to the switching transistor means.

2. The POR circuit of claim 1, wherein the means for setting-temperature independent time delay comprising a plurality of diode means electrically coupled in series to one another.

3. The POR of claim 2, wherein the plurality of diode means for setting the temperature independent time delay comprises:
   a first n-channel MOS transistor (NMOS) connected as a diode having a gate electrically coupled to a drain and to a second terminal of the CMOS capacitor;
   a second n-channel MOS transistor (NMOS) transistor connected as a diode having a gate electrically coupled to a drain and to a source of the first NMOS transistor; and a low-threshold n-channel MOS (NMOS) transistor connected as a diode with a gate electrically coupled to a drain and to a source of the second NMOS transistor.

4. The POR circuit of claim 2, wherein the plurality of diode means comprising a plurality of p-n junction diodes coupled together in series, each diode having an anode and a cathode; wherein the cathode of a first diode is coupled to power supply voltage and protecting the POR circuit from ESD and latch-up, and of the last p-n diode is coupled to the switching transistor means.

5. The POR circuit of claim 1, further comprises a means for coupling to the power supply voltage and for protecting the POR circuit against latch-up and ESD comprising:
   a p-channel MOS (PMOS) transistor having a drain electrically coupled to the power supply voltage, a gate electrically coupled to an electrical ground.

6. The POR circuit of claim 1, wherein the switching transistor means is an n-channel MOS (NMOS) transistor having a source coupled to the electrical ground, a gate electrically coupled to a first terminal of a pull-down resistor, and a drain coupled to a first terminal of a pull-up resistor, wherein a second terminal of the pull-up resistor is coupled to the power supply voltage.

7. The POR circuit of claim 1, wherein the plurality of buffer circuits comprises a plurality of MOS inverters coupled in series to one another and an input terminal of a first CMOS inverter is electrically coupled to the drain of the transistor means and an output terminal of a last MOS inverter forms an output of the POR circuit.

8. The POR circuit of claim 1, wherein the buffer circuit comprises a first MOS inverter coupled in series to a second MOS inverter and a third MOS inverter.

9. The POR circuit of claim 1, wherein the buffer means further comprising:
   a first pull-up MOS capacitor having a first terminal coupled to the power supply voltage and a second terminal coupled to the gate of the n-channel MOS transistor;
   a first CMOS inverter having an input terminal coupled to the second terminal of the second p-channel MOS capacitor;
   a first pull-down MOS capacitor having a first terminal coupled to the output of the first CMOS inverter and the second terminal coupled to the electrical ground;
   a second CMOS inverter having an input terminal electrically coupled to the output terminal of the first CMOS inverter;
   a second pull-up MOS capacitor having the first terminal electrically coupled to the output terminal of the second CMOS inverter and a second terminal coupled to the power supply voltage;
   a third CMOS inverter having an input terminal electrically coupled to the output terminal of the second CMOS inverter;
   a second pull-down MOS capacitor having a first terminal coupled to the electrical ground and a second terminal electrically coupled to the output terminal of the third CMOS inverter;
   a fourth CMOS inverter having an input terminal coupled to the output terminal of the third CMOS inverter; and
   a fifth CMOS inverter having an input terminal electrically coupled to the output terminal of the fourth terminal and an output terminal forms an output of the CMOS POR circuit.

10. A power-on reset circuit having a trip point, comprising:
   a p-channel MOS (PMOS) transistor having a source electrically coupled to a power supply voltage, a gate electrically coupled to an electrical ground;
   a first NMOS transistor connected as a diode having a gate electrically coupled to a drain and to a second terminal of a first CMOS capacitor;

a second NMOS transistor connected as a diode having a gate electrically coupled to a drain and to a source of the first NMOS transistor;

a low-threshold n-channel MOS (NMOS) transistor with a gate electrically coupled to a drain and to a source of the second NMOS transistor;

a pull-down resistor having a first terminal and a second terminal, the first terminal being electrically coupled to a source of the p-channel MOS transistor and the second terminal electrically coupled to an electrical ground so that the current flowing from the power supply voltage through the pull-down resistor is limited; and a transistor switch having a source coupled to the electrical ground and a gate electrically coupled to the first terminal of the resistor detecting a rising edge of the power voltage supply, wherein the trip point of the POR circuit depends on the characteristics of the transistor switch;

a pull-up resistor having a first terminal and a second terminal, first terminal being electrically coupled to the power supply voltage and the second terminal is coupled to a drain of the CMOS switch; and a plurality of CMOS inverters coupled in series to one another and an input terminal of the a first CMOS inverter is electrically coupled to the second terminal of the pull-up resistor and an output terminal of a last CMOS inverter forms an output of the CMOS POR circuit.

11. A CMOS power-on reset (POR) circuit having a trip point, comprising:

a first p-channel MOS (PMOS) transistor having a source electrically coupled to a power supply voltage, a gate electrically coupled to an electrical ground;

a first n-channel MOS (NMOS) transistor connected as a diode with a drain electrically coupled to the source of the p-channel MOS transistor and a gate electrically coupled to the drain;

a pull-down resistor having a first terminal coupled to the source of the first NMOS transistor and a second terminal electrically coupled to the electrical ground so that current flowing from the power supply voltage to ground is limited;

an n-channel MOS (NMOS) transistor switch having a gate electrically coupled to the first terminal of the pull-down resistor and a source electrically coupled to the electrical ground;

a first pull-up n-channel MOS (NMOS) transistor having a drain electrically coupled to the power supply voltage, a gate coupled to the electrical ground and a source electrically coupled to the drain of the NMOS transistor, wherein the trip point of the POR circuit depends on electrical characteristics of the NMOS transistor switch;

a first pull-up p-channel MOS (PMOS) capacitor having a first terminal coupled to the voltage power supply and a second terminal coupled to the drain of the NMOS transistor;

a first CMOS inverter having an input terminal coupled to the second terminal of the first PMOS capacitor; a first pull-down p-channel MOS (PMOS) capacitor having a first terminal coupled to an output of the first CMOS inverter and the A second terminal coupled to the electrical ground;

a second CMOS inverter having an input terminal electrically coupled to the output terminal of the first CMOS converter;

a second pull-up p-channel MOS (PMOS) capacitor having a first terminal electrically coupled to an output terminal of the second CMOS inverter and a second terminal coupled to the power supply voltage;

a third CMOS inverter having an input terminal electrically coupled to the output terminal of the second CMOS inverter;

a second pull-down p-channel(PMOS) capacitor having a first terminal coupled to the electrical ground and a second terminal electrically coupled to an output terminal of the third CMOS inverter;

a fourth CMOS inverter having an input terminal coupled to the output terminal of the third CMOS inverter; and a fifth CMOS inverter having an input terminal electrically coupled to the output terminal of the fourth CMOS inverter and an output terminal which forms an output of the CMOS POR circuit.

12. A digital system, comprising:

a digital circuit connected to a power supply voltage;

a power-on reset circuit coupled to the power supply voltage and the digital circuit, the power-on reset circuit comprising:

a p-channel MOS (PMOS) transistor having a source electrically coupled to a power supply voltage and a gate electrically coupled to an electrical ground;

a first NMOS transistor connected as a diode having a gate electrically coupled to a drain and to a second terminal of a first CMOS capacitor;

a second NMOS transistor connected as a diode having a gate electrically coupled to a drain and to a source of the first NMOS transistor;

a low-threshold n-channel MOS (NMOS) transistor connected as a diode with a gate electrically coupled to a drain and to a source of the second NMOS transistor;

a pull-down resistor having a first terminal and a second terminal, the first terminal is electrically coupled in series with the source of the p-channel MOS transistor and the second terminal electrically coupled to the electrical ground so that the current flowing from the power supply voltage through the pull-down resistor is limited;

a transistor switch having a source coupled to the electrical ground and a gate electrically coupled to the first terminal of the null-down resistor for detecting the rising edge of the power voltage supply, wherein a trip point of the POR circuit depends on the characteristics of the transistor switch;

a pull-up resistor having a first terminal and a second terminal, the first terminal being electrically coupled to the power supply voltage and the second terminal is being coupled to a drain of the transistor switch; and a plurality of MOS inverters coupled in series to one another and an input terminal of a, first MOS inverter is electrically coupled to the second terminal of the pull-up resistor and an output terminal of a last MOS inverter forming an output of the power-on reset circuit.

13. A digital system, comprising:

a digital circuit connected to a power supply voltage;

a power-on reset circuit coupled to the power supply voltage and the digital circuit, power-on reset circuit comprising:

a first p-channel MOS (PMOS) transistor having a source electrically coupled to a power supply voltage and a gate electrically coupled to an electrical ground;

a second p-channel transistor with a drain electrically coupled to the source of the p-channel MOS transistor and a gate electrically coupled to the drain;

a pull-down resistor having a first terminal coupled to the source of the second PMOS transistor, and a second terminal electrically coupled to the electrical ground so that current flowing from the power supply voltage to ground is limited;

an n-channel MOS (NMOS) transistor having a gate electrically coupled to the first terminal of the resistor and a source electrically coupled to the electrical ground;

a first pull-up n-channel MOS (NMOS) transistor having a drain electrically coupled to the power supply voltage, a gate coupled to the electrical ground, and a source electrically coupled to the drain of the NMOS transistor, wherein a trip point of the power-on reset circuit depends on the circuit of the NMOS transistor;

a first pull-up p-channel MOS (PMOS) capacitor having a first terminal coupled to the voltage power supply and a second terminal coupled to a drain of the NMOS transistor;

a first MOS inverter having an input terminal coupled to the second terminal of the first PMOS capacitor;

a first pull-down p-channel MOS (PMOS) capacitor having a first terminal coupled to an output of the first MOS inverter and a second terminal coupled to the electrical ground;

a second MOS inverter having an input terminal electrically coupled to the output terminal of the first MOS inverter;

a second pull-up p-channel MOS (PMOS) capacitor having a first terminal electrically coupled to the an output terminal of the second MOS inverter and a second terminal coupled to the power supply voltage;

a third MOS inverter having an input terminal electrically coupled to the output terminal of the second MOS inverter;

a second pull-down MOS (PMOS) capacitor having a first terminal coupled to the electrical ground and a second terminal electrically coupled to an output terminal of the third MOS inverter;

a fourth MOS inverter having an input terminal coupled to the output terminal of the third MOS inverter; and a fifth MOS inverter having an input terminal electrically coupled to an output terminal of the fourth terminal and an output terminal forming an output of the power-on reset circuit.

* * * * *

UNITED STATES PATENT AND TRADEMARK OFFICE
CERTIFICATE OF CORRECTION

PATENT NO. : 6,744,291 B2
DATED : June 1, 2004
INVENTOR(S) : James E. Payne et al.

It is certified that error appears in the above-identified patent and that said Letters Patent is hereby corrected as shown below:

Column 7,
Line 1, "a low threshold voltage;" should read -- a low threshold voltage of about 0.2 volts; --.

Column 9,
Lines 12-13, "...resistor is limited; and" should read -- resistor is limited; --.
Lines 63-64, "inverter and the A second terminal..." should read -- inverter and a second terminal... --.

Column 10,
Line 44, "...terminal of the null-down resistor..." should read -- ...terminal of the pull-down resistor... --.
Lines 50-51, "...second terminal is being coupled to a drain..." should read -- ...second terminal being coupled to a drain... --.

Signed and Sealed this

Twelfth Day of April, 2005

JON W. DUDAS
*Director of the United States Patent and Trademark Office*